US008053168B2

(12) United States Patent
Daniel et al.

(10) Patent No.: US 8,053,168 B2
(45) Date of Patent: Nov. 8, 2011

(54) PRINTING PLATE AND SYSTEM USING HEAT-DECOMPOSABLE POLYMERS

(75) Inventors: Jurgen H. Daniel, San Francisco, CA (US); Eugene M. Chow, Fremont, CA (US); Dirk De Bruyker, Palo Alto, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 73 days.

(21) Appl. No.: 11/613,152

(22) Filed: Dec. 19, 2006

(65) Prior Publication Data

US 2008/0141880 A1 Jun. 19, 2008

(51) Int. Cl.
*G03F 7/00* (2006.01)
*B41N 1/10* (2006.01)
*B41N 6/00* (2006.01)

(52) U.S. Cl. .......................... 430/300; 430/330; 101/395

(58) Field of Classification Search ............... 430/270.1, 430/302, 303, 330
See application file for complete search history.

(56) References Cited

U.S. PATENT DOCUMENTS

| | | | | |
|---|---|---|---|---|
| 3,615,453 | A * | 10/1971 | Jenkins et al. | 430/270.1 |
| 5,780,200 | A * | 7/1998 | Kitaguchi et al. | 430/270.1 |
| 5,955,238 | A * | 9/1999 | Yokoya et al. | 430/166 |
| 6,030,749 | A * | 2/2000 | Takahashi | 430/273.1 |
| 2001/0003637 | A1* | 6/2001 | Goto | 430/200 |
| 2003/0073032 | A1* | 4/2003 | Aoshima | 430/271.1 |
| 2003/0129523 | A1* | 7/2003 | Matsumoto et al. | 430/138 |
| 2003/0213391 | A1* | 11/2003 | Suda et al. | 101/463.1 |
| 2003/0222048 | A1* | 12/2003 | Asakawa et al. | 216/2 |
| 2005/0181302 | A1* | 8/2005 | Kawamura | 430/270.1 |
| 2006/0115768 | A1* | 6/2006 | Oohashi et al. | 430/270.1 |
| 2006/0185542 | A1* | 8/2006 | Hayashi | 101/453 |
| 2007/0259474 | A1* | 11/2007 | Shin et al. | 438/99 |

FOREIGN PATENT DOCUMENTS

WO WO 02/051639 A2 * 7/2002

* cited by examiner

*Primary Examiner* — Cynthia Kelly
*Assistant Examiner* — Chanceity Robinson
(74) *Attorney, Agent, or Firm* — Marger Johnson & McCollom, P.C.

(57) ABSTRACT

A printing plate has a substrate and a heat decomposable polymer layer arranged adjacent to the substrate, the decomposable polymer having defined regions within the polymer layer to form a printing pattern. The printing plate may be used in a printing system. The printing plate is formed in a process by providing a substrate, coating the substrate with a heat decomposable polymer to form a plate, and forming a printing pattern in the heat decomposable polymer by selectively decomposing regions of the heat decomposable polymer.

18 Claims, 7 Drawing Sheets

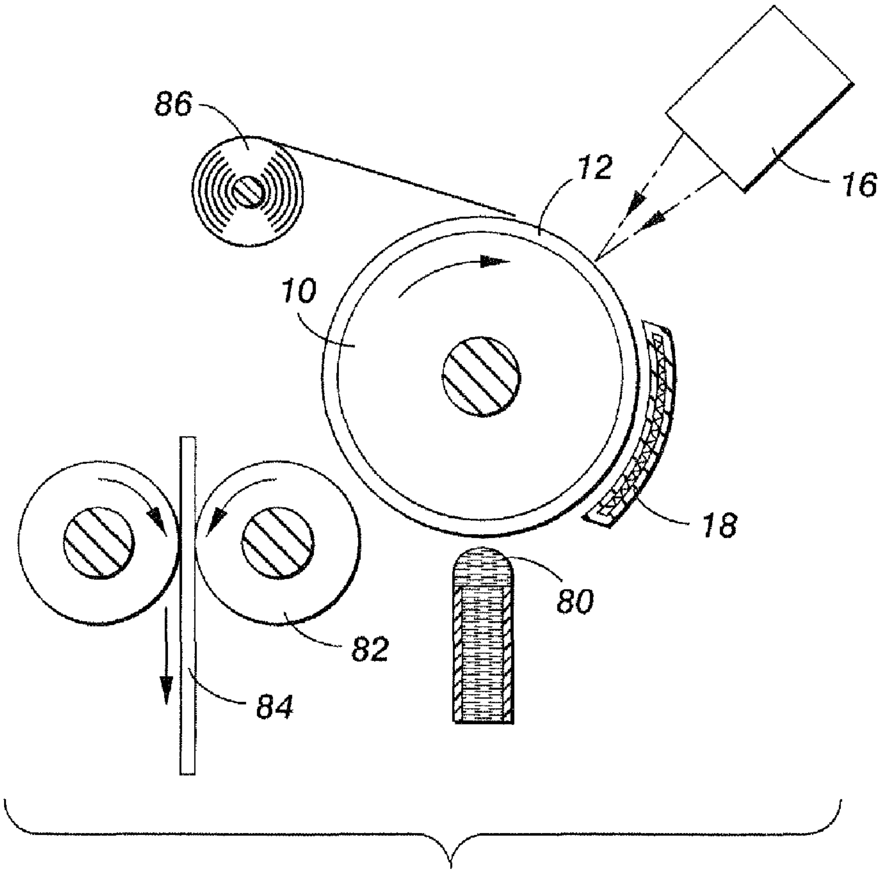
FIG. 15
FIG. 16
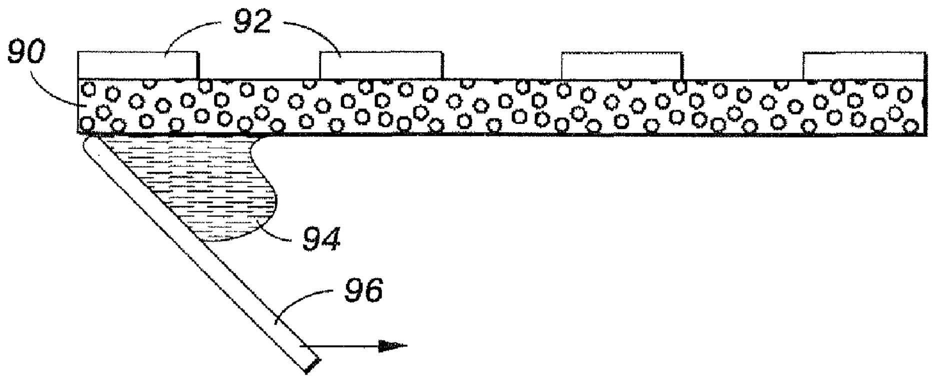

PRINTING PLATE AND SYSTEM USING HEAT-DECOMPOSABLE POLYMERS

RELATED APPLICATIONS

This application is related to the following co-pending US patent applications, filed the same date and incorporated herein by reference in their entirety:

U.S. patent application Ser. No. 11/613,141, "Printing System Employing Deformable Polymerdeformable Polymer Printing Plates,"; and U.S. patent application Ser. No. 11/613,159, "Digital Printing Plate and System with Electrostatically Deformable Membranes,".

BACKGROUND

Gravure, flexography and offset printing generally are high speed printing processes that result in high quality printed images. The high speed results from the 'stamping' nature of these processes, where a printing surface or printing plate has a printing pattern formed on it that, when inked and transferred to a printing substrate, forms a print image. After the inking process, the ink is transferred from the print image to a printing substrate. High quality prints are achieved due to the use of high viscosity inks with high pigment loading and due to printing at high pixel or ink dot density. The printing plate and printing pattern may take different forms depending upon the printing process in which they are used.

In gravure printing, the printing plate, which may actually be a cylinder used in a rotary printing press, has wells formed in the areas needed to form the desired image. The surface receives the ink and a blade, such as a doctor blade common to printing systems, removes any excess, so that the ink is captured only in the wells. Varying the depth of the wells achieves images with better gray-scale. The system then applies a high contact pressure to the printing surface against a printing substrate to transfer the ink to the printing substrate. A printing substrate may include paper, transparency, foils, plastics, or an impression roller, etc. Generally, due to the high contact pressure necessary, gravure printing processes print to paper or relatively sturdy substrates.

In flexographic printing, the process has many similar steps, except that the system raises the wells, or inked pixels, above the surface, similar to a rubber stamp. Ink transfer occurs with less force, so the process can use 'softer' printing plates made out of rubber or other elastomers more appropriate for printing substrates or media other than paper, such as transparencies, foil, labels, plastic, etc. For purposes of the discussion here, the wells of gravure printing, the inked pixels above the surface for flexographic printing, or any other region on the surface of the printing plate that is defined to form a printing pattern will be referred to as 'defined regions.'

In either of the above examples, as well as many others, the term 'printing plate' means the surface upon which the print pattern is formed and is initially inked. For gravure printing, it may be a metal cylinder that is engraved with the recesses to capture ink, for flexography it may be a rubber cylinder or partial cylinder that has raised areas for accepting ink. In other applications, such as offset printing, the print image may be formed on the printing page by areas that accept ink and areas that do not.

Another possible printing system would be screen printing. In screen printing, a screen of highly porous, finely woven material is coated in areas in which ink is not desired and left porous where ink is desired. A squeegee or rubber blade pushed ink through the porous portions of the screen onto the substrate. In this instance, the printing plate would be the screen and the printing image is the image formed by the areas of porosity of the screen.

Both gravure and flexographic printing generally require etching of a master plate using wet processing involving various chemicals with drying steps that takes a relatively long time. Dry processes are desirable, but current techniques generally require a powerful laser to etch the plates.

SUMMARY

One embodiment is a printing plate having a substrate and a heat decomposable polymer layer arranged adjacent to the substrate, the decomposable polymer having defined regions within the polymer layer to form a printing pattern.

Another embodiment is the printing plate used in a printing system.

Another embodiment is a method of forming a printing plate by providing a substrate, coating the substrate with a heat decomposable polymer to form a plate, and forming a printing pattern in the heat decomposable polymer by selectively decomposing regions of the heat decomposable polymer.

BRIEF DESCRIPTION OF THE DRAWINGS

FIG. 15 shows a block diagram of an example of a printing system.

FIG. 16 shows an example of a screen printing plate.

DETAILED DESCRIPTION

Printing processes such as offset, flexographic, gravure or letterpress printing use printing plates to transfer an image to paper or other substrates. As discussed above, the printing plate is the surface or component upon which the printing image that is to be inked is formed, such as a gravure plate, a flexography plate, a print screen, or an offset print plate. The print image may be positive or negative. Typically, printing plates are attached to a cylinder in the printing press and will be referred to as having a cylindrical structure, whether the plates form a complete cylinder or merely a portion, such as a half cylinder. Ink is applied to the plate's image area and transferred directly to the paper or to an intermediary cylinder and then to the paper.

The ink may be a commonly used printing ink, including inks with color pigments or dye containing inks, UV curable inks, etc. The inks may also be used for patterning electronic circuits and they may have an electronic functionality, such as conductive inks, semiconductive inks, or inks containing precursors for conductive, semiconductive or insulating properties.

Screen printing is another printing method. In screen printing, the screen is the equivalent of the printing plate. It can be created manually or photochemically and is usually a porous fabric or stainless steel mesh stretched over a frame.

Figure 1:
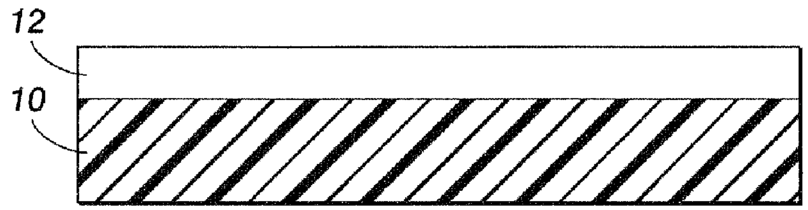
FIGS. 1-3 show an example of a method of forming a printing plate.

FIG. 1 shows an example of a plate that can be formed into a printing plate. A substrate 10 has formed upon it a heat decomposable polymer 12. The substrate may be flat, cylindrical, formed into a sheet that can subsequently be formed around a cylinder, etc. Most polymers undergo a decomposition reaction, pyrolysis, at a certain temperature. However, pyrolysis usually takes place at rather high temperatures of several hundred degrees Celsius. A type of vaporization of solids similar to thermal decomposition is employed in the area of dye sublimation printing where dyes are thermally evaporated. In this case the vaporization is a phase transition from solid to vapor.

Recently, photodefinable sacrificial polymers have been developed. These polymers undergo a thermal decomposition at relatively low temperatures (<~200° C.), preferentially in the regions that were illuminated with ultraviolet light. This characteristic allows patterning of the materials using UV light and heat. In contrast, conventional photopolymers which are used for pattern formation rely on UV light exposure and subsequent chemical development using solvents.

One materials class of photodefinable decomposable polymers is based on polycarbonates. The addition of a photoacid generator (PAG) to the polymer such as polycarbonate causes strong acid generation in the exposed areas during UV light illumination. This reduces the thermal decomposition temperature of the polymer and during the post exposure bake (PEB) at elevated temperatures (<~115° C.) the polymer in the exposed areas is catalytically decomposed by the acid. The unexposed regions of the polymer are not affected as long as a thermally stable PAG is used, such as onium salt. A commercially available photosensitive heat decomposable polymer is Unity™ 2203 from Promerus, LLC.

As used here, the term 'decomposable polymer' will mean any polymer that decomposes into substantially volatile products when heated at relatively low temperatures. In one example, these polymers decompose at temperatures less than 400° C. The decomposable polymer may contain a photoacid generator (PAG). The acid is created either photolytically when exposed to UV radiation or thermolytically when heated to the decomposition temperature of the PAG. The term 'photodefinable decomposable polymer' will mean any polymer that is sensitive to actinic light, such as UV light, and after being exposed to light, the regions so exposed will decompose at temperatures of 300° C. or lower, preferably 200° C. or lower. As will be discussed in more detail below, in some polymers it is possible that one could localize the decomposition of the polymer to an extent that photodefinition would not be needed.

Many methods may apply the heat decomposable polymer to the substrate, such as an applicator, applying a sheet to the substrate, depositing, etc. The heat decomposable polymer has the property that when exposed to heat, the polymer decomposes leaving pits or wells in the surface of the polymer where the heat was applied. The depth of the wells progresses with the heating time and it may continue until the substrate becomes exposed. In the photodefinable, heat decomposable polymer, those pits or wells form upon heating where the polymer had been exposed to UV light.

Figure 2:
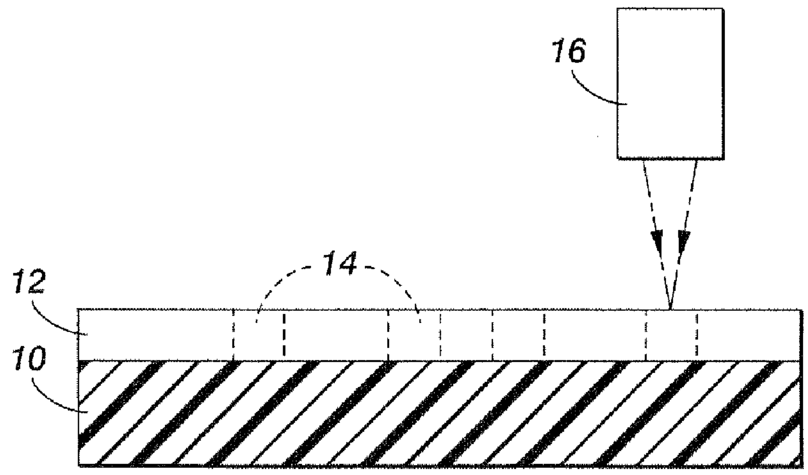

One embodiment of the heat decomposable polymer has a sensitivity to actinic light such as ultraviolet (UV) light. UV light typically covers the wavelength range from 1-450 nm but other wavelength ranges may be also suitable for exposing the polymer. FIG. 2 shows an example of writing a print image onto the surface of the polymer using a UV light source 16, such as a focused UV laser or laser diode.

Laser ablation of a surface to form the print image has occurred in current implementations of printing systems, but relatively high-power lasers are required. One current method involves a printing plate for computer-to plate lithography having a laser-ablatable member supported by a substrate. At least one portion of the laser-ablatable member is formed form an acrylic polymer containing laser-sensitive particles. The laser-sensitive particles absorb imaging radiation and cause the portion of the laser-ablatable member containing the laser sensitive particles and any overlying layers to be ablated. This approach uses high-powered lasers.

The ability to write the pattern using low power UV lasers followed by heating allows for a cheaper and potentially less complex process. In one example, a laser diode with 8 mW power at a wavelength of ~370 nm, such as one available from Power Technology, Inc, irradiates the polymer, such as Unity 2203 from Promerus, LLC.

For example, such a laser having a spot of 10 microns and a power density of approximately $1\times10^7$ mW/cm$^2$ exposes the polymer. Assuming that a fluence of 500 mJ/cm$^2$ exposes the polymer sufficiently, a laser dwell time of about 50 microseconds is required to trigger the decomposition of the polymer upon heating. It would take about 5 minutes to expose a 1×1 inch area of polymer, corresponding to 2540×2540 dots. Multiple lasers, a higher laser power or a higher sensitivity of the polymer would result in faster write speed. It also should be mentioned that the spot size of the laser may be changed and also the shape of the exposure light beam may vary and either be a spot or a line pattern, etc.

Figure 3:
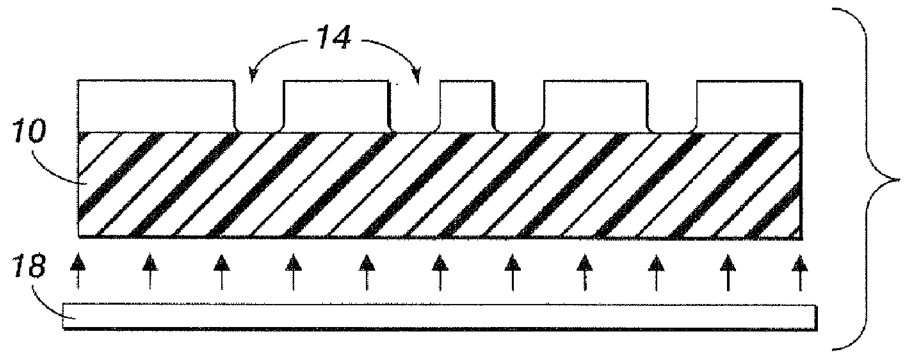

The regions 14 exposed to the UV light will decompose when heated while those regions not exposed to UV light will not decompose or they will decompose more slowly. FIG. 3 shows the formation of the wells by application of heat to the decomposable polymer using a hot plate 18. Alternatively, a radiative heat source such as an infrared lamp may heat the polymer layer 12. When heated, the UV exposed areas decompose and the surrounding nonexposed regions do not decompose or they decompose much more slowly. In one example the polymer layer was heated for 5 minutes at 120° C. on a hotplate. In the example of a gravure plate, the defined regions 14 form pixels in the print image and the depth of the wells generally increases with the exposure fluence, the heating time and the heating temperature. In one example of a gravure plate the depth of the wells is between 10 and 30 micrometers.

One alternative to exposing the polymer using lasers or laser diodes in a scanning fashion would involve a spatial light modulator which could image the UV light onto the polymer. A spatial light modulator generally has an array of light 'valves' that either transmit or reflect light towards an imaging surface, or the valves block or reflect light away form the imaging surface. An example of a spatial light modulator includes a Digital Micromirror Device (DMD) manufactured by Texas Instruments. Many other methods of exposure are of course possible. The exposed polymer would then be heated to decompose the polymer.

After decomposing the polymer a cleaning step may be required to remove remaining residue. This could be done with a cloth or a fabric roller which may contain a small amount of solvent. In order to remove particulate residue, a tacky or sticky roller such as a silicone coated roller may be used. The printing surface may now have ink applied to it and come into contact with a printing substrate or offset sheet for printing.

Figure 4:
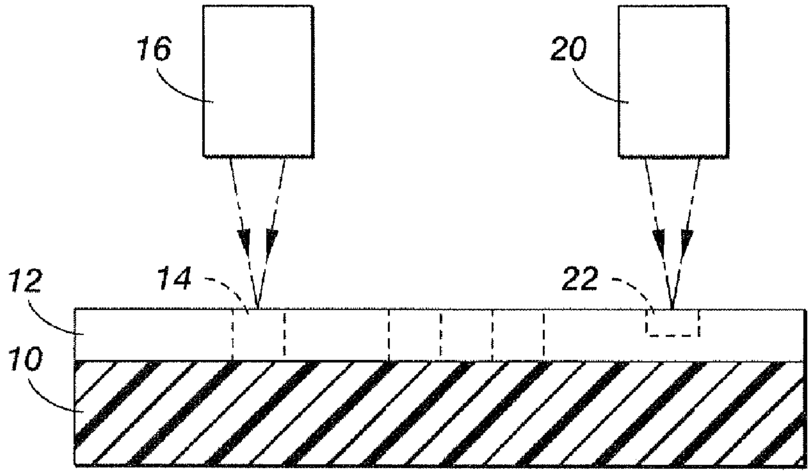
FIGS. 4-5 show an alternative example of a method of forming a printing plate.
Figure 5:
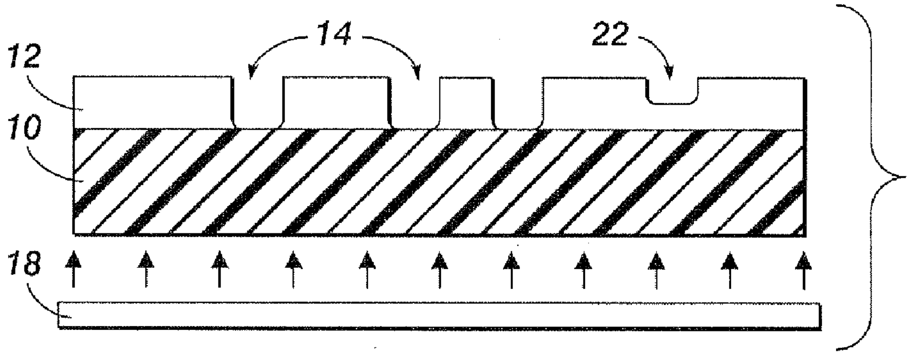

FIGS. 4 and 5 show an example of an alternative process for forming a printing plate. In FIG. 4, two UV lasers or laser diodes direct UV light onto the heat decomposable polymer 12 residing on substrate 10. The first laser 16 exposes the area 14 with a first fluence, and a second laser 20 exposes the area 22 with a second fluence. The exposure to the first laser 16 results in a region 14 and exposure to the second laser 20 results in a second region 22. The fluence of the laser light in area 14 is supposed to be higher than the one in area 22.

In FIG. 5, the process heats the substrate and polymer, together referred to as a printing plate, causing the region 14 to form a deeper well than region 22. In this manner, different exposure fluences could form gray scale in a gravure-type printing plate. The different exposure fluences can be achieved either by modulating the power of the laser(s) or by varying the laser dwell time. A polymer having different sensitivities to different wavelengths of light could also result in different pit depths if the wavelength of the UV light is modulated.

Figure 6:
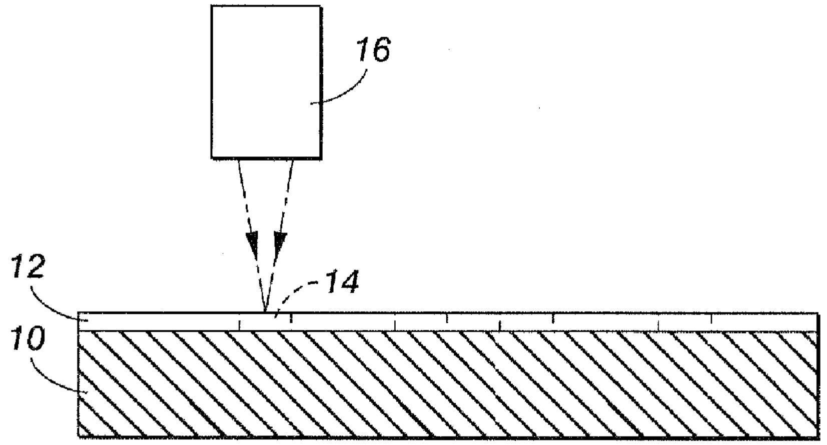
FIGS. 6-7 show an alternative example of a method of forming a printing plate.
Figure 7:
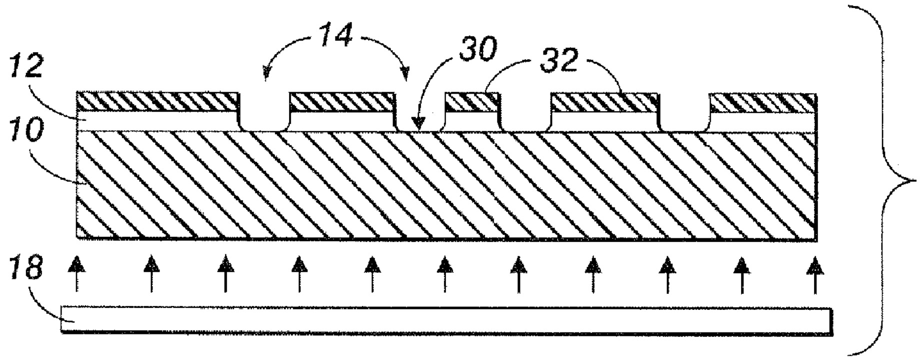

FIGS. 6 and 7 show an example of a method of forming an offset plate. If the substrate 10 were hydrophilic, the exposure by laser 16 and subsequent heating by heat source 18 would cause the decomposition of the polymer 12 in defined regions 14 and would uncover portions of the substrate 10. An anodized aluminum substrate is one example of a hydrophilic substrate often used in offset plates. As shown in FIG. 7, the portions of the hydrophilic regions 30, which in offset printing are attracting the aqueous fountain solution, would repel the ink, while the defined regions of the polymer would accept offset ink as shown by the ink 32. This ink pattern would then transfer onto the offset sheet and then to a print substrate.

Figure 8:
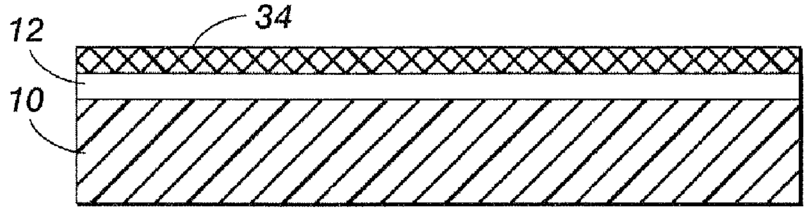
FIGS. 8-9 show an alternative example of a method of forming a printing plate using an alternative embodiment of a plate.
Figure 9:
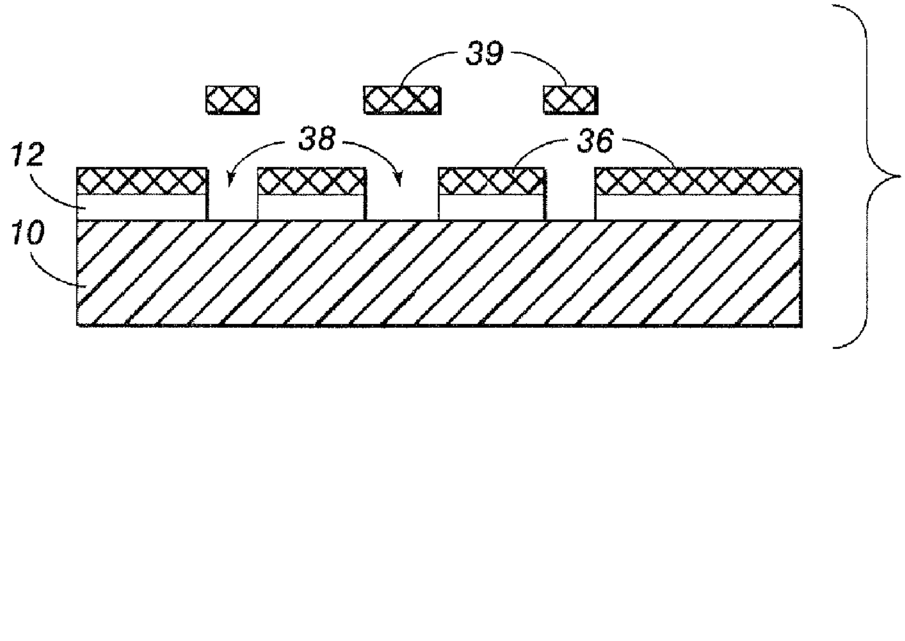

Apart from wet-offset printing, dry or water-less offset printing is becoming increasingly important. Waterless offset uses the concept of differential adhesion to keep image and non-image plate areas separate during printing. This process does not use a fountain solution. To achieve this type of printing, the method uses an ink-repelling layer such as a silicone coating on the surface of the offset plate. During plate development the ink-repelling layer is removed from the image area of the plate. The ink-repelling layer is not removed, however, from the non-image areas. The image areas, or defined regions, without an ink-repelling layer now sit slightly below the non-image area having the ink-repelling layer forming very shallow wells or regions to hold the ink. The ink is formulated to resist adhesion to the ink-repelling layer but will deposit in the shallow defined regions having no ink-repelling layer. FIGS. 8 and 9 show an example of a method of forming a printing plate. To differentiate the plate formed by this manner from the previous offset method discussed above, this example will be referred to as a dry offset plate.

In this method, the patterning of the ink-repelling layer could be achieved with a thin layer of decomposable polymer 12 positioned below the ink-repelling layer 34 in a printing plate substrate 10.

In the areas where the polymer is caused to decompose, the ink-repelling layer loses adhesion to the substrate. In these loose regions such as 38, the 'sections' such as 39 of the ink repelling layer can be wiped off or otherwise easily removed such as in commonly known lift-off techniques. The areas in which the UV exposed polymer did not decompose form the non-image areas such as 36. The heat decomposable layer could be rather thin such as sub-micrometer thin, since it mainly serves as an adhesion layer that can be patterned between the ink-repelling layer and the substrate. In the previous description of a dry offset plate the ink repelling layer is selectively lifted off. However, in the same way an ink-accepting layer may be lifted off, revealing an ink-repelling layer underneath.

Figure 10:
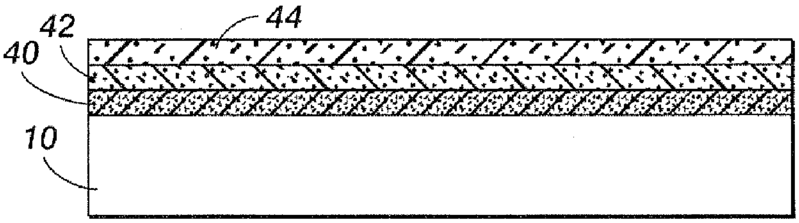
FIGS. 10-11 show an alternative example of a method of forming a printing plate using an alternative embodiment of a plate.
Figure 11:
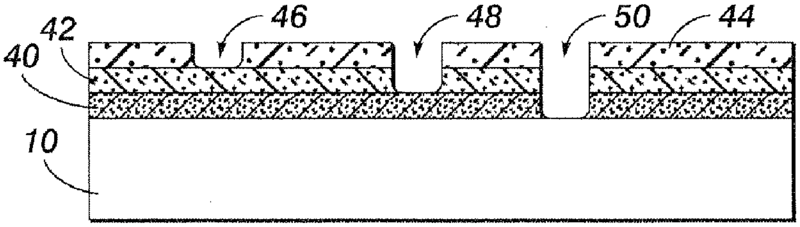

In another embodiment of the plate, which particularly applies to gravure plates, layered polymer films may reside on the substrate. FIGS. 10 and 11 show an example of such a layered film. In this example, three films form the heat decomposable polymer. Of course, the stack of layers could also only consist of two layers or of more than three layers. Each film 40, 42 and 44 responds to a different wavelength of light or to different temperatures. This may result from each film having a different photo initiator or photoacid generator (PAG). For example, photoacid generators CGT 1311 and CGI 263 manufactured by Ciba Specialty Chemicals, Inc., exhibit different UV light absorption behavior. The CGI 1311 at 0.5 mg/ml in acetonitrile absorbs light at wavelengths below ~450 nm. On the other hand, the CGI 263 (at 0.5 mg/ml in acetonitrile) absorbs only light below ~320 nm and is substantially transmissive to light around 450 nm. The sensitivity to different wavelengths of light may also be tailored by varying the concentration of photoacid generator. For example, CGI 1311 at a concentration of 0.01 mg/ml in acetonitrile shows low absorption at wavelengths above 250 nm while at 0.5 mg/ml it exhibits high absorption of light below ~450 nm.

FIG. 11 shows a result after application of one, two or three different sources of light. Defined regions 46, 48 and 50 have all received light of one range of wavelengths, which will result in decomposition of the first film 44 in region 46 when heated.

Alternatively, if the polymer layers are made of polymers with different decomposition temperatures, e.g. by employing PAGs with different decomposition temperatures, the regions 46, 48, 50 may have been heated to one low temperature range. Regions 48 and 50 have received light of a second range of wavelengths, which results in decomposition of the second film 42 in these regions when heated.

Alternatively, if the polymer layers are made of polymers with different decomposition temperatures, the regions 48 and 50 may have been heated up to a higher temperature to decompose the polymer layer 42. Finally, region 50 has received light of a third range of wavelengths, which results in the decomposition of the third film 40 in this region when heated. In one scenario, the three wavelength ranges may be substantially non-overlapping. In another scenario, the second range of wavelengths may include at least part of the first range of wavelengths and the third range of wavelengths may include at least part of the first and the second range of wavelengths. The resulting surface has regions with three different well depths, allowing gray scale printing.

Another application of a multilayer film involves using a thin compliant layer under the decomposable polymer film. Flexography applications may benefit from local compliance. The compliant layer may have thermal properties to be laterally thermally isolating and vertically thermally conducting for efficient hot plate heating. Such anisotropic thermal conductivity may be due to preferential molecular orientation perpendicular to the substrate or it may be due to an anisotropic microstructure of the compliant layer material. This may also benefit pixellized plates.

In another alternative, the process may write the print image without using UV light. The image could result from direct application of heat to regions of the heat decomposable polymer. As mentioned before, this may be due to thermolytical decomposition of the PAG in the polymer. For example, a thermal print head could pattern the polymer with the print pattern by decomposing selected regions of the polymer. As discussed previously, a printing surface or printing plate has a printing pattern formed on it that, when inked and transferred to a printing substrate, forms the print image.

One example of a thermal printhead has a plurality of heating elements for converting electrical energy into thermal energy on a resistance substrate. The resistance substrate is a panel having electrical and thermal insulating characteristic and rigidity. The heating elements are formed linearly like a row of dots that would be used to heat the heat decomposable polymer.

In another example, an array of microheaters could reside in/on the substrate and individually heat the regions to form the wells or pits. However, lateral thennal conduction is a concern and it requires a substrate material with low lateral thermal conductivity. Thermal barrier ceramics such as partially yttria-stabilized zirconia or pyrochlore oxides may be examples. With this type of localized heating using microheaters or heating elements, a heat decomposable polymer that does not require UV light exposure may be used.

In yet another example the local heating could be due to infrared (IR) radiation which is focused onto the polymer sheet, for example by using IR laser light. The substrate may contain an array of IR light absorbing structures or 'pixels.' The IR light beam may heat these heat-absorbing 'pixels' so that they appear like microheaters. Prior art has used infrared laser light to ablate or melt a polymer sheet to fabricate printing plates. Here the infrared light would be used in conjunction with the heat decomposable polymer.

Figure 12:
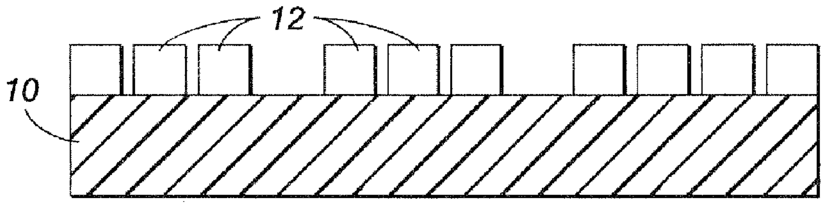
FIG. 12 shows an alternative example of a method of forming a printing plate using an alternative embodiment of a plate.

The continuous polymer layer 12 of FIG. 1 may instead be discontinuous. FIG. 12 shows a decomposable polymer layer which is pixilated, which means it is patterned into small cubical or similar geometrical structures which are substantially isolated from each other. Such pixilation could be achieved by molding the polymer into this shape or by patterning a continuous polymer layer by stamping, cutting, photolithography or commonly known micromachining methods. The pixilation can reduce lateral heat spreading within the polymer layer when heating elements are used to decompose selected regions or the polymer.

In the example of a pixilated decomposable polymer layer, an opaque material may fill the gaps to prevent light spreading during exposure of photodefinable heat decomposable polymer. Pixilation may also help prevent diffusion of the photo initiator during heating. Diffusion of the photo initiator may result in widening of the print feature size, typically an undesirable result.

Figure 13:
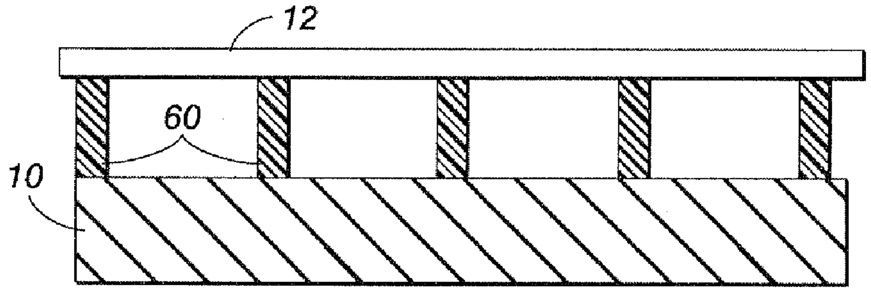
FIGS. 13-14 show an alternative example of a method of forming a printing plate using an alternative embodiment of a plate.
Figure 14:
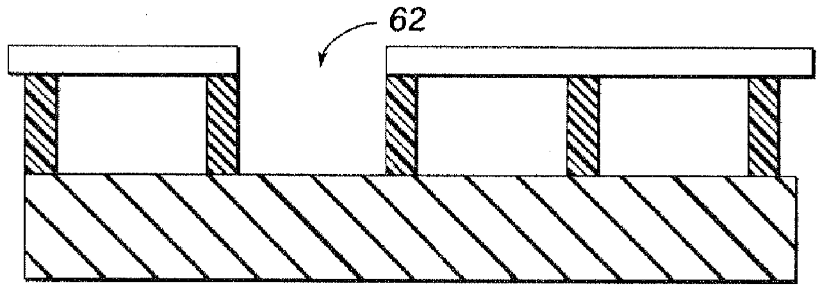

In yet another embodiment, the decomposable polymer may form a membrane suspended over the substrate as shown in FIGS. 13 and 14. The substrate 10 has formed upon it an array of walls 60 that form microcells. Although the walls 60 are shown to be formed on the substrate 10, which could be done for example by electroplating methods or other additive micromachining methods, the walls 60 may be also formed by etching wells/pits into the substrate material 10. The heat decomposable polymer 12 then covers the array of walls, perhaps by laminating the polymer membrane to the tops of the cell walls. Generally, this approach may use a thinner heat decomposable polymer membrane. For example, the cell pitch could be 25 micrometers and the laminated membrane could be ~5 micrometer thick. This may result in a shorter process time, since less membrane material needs to be decomposed to form the region 62 shown in FIG. 14.

One concern may arise from the thinner membrane because of the pressure during the printing process and the potential deformation or rupture of the membrane. A phase-change material such as wax or a low-melting point polymer may reside inside the cells to provide support for the membrane. Examples of potential wax materials includes a pattern material used in casting molds, the pattern material being characterized by a low injection temperature, a low coefficient of expansion and insubstantial cavitation after injection into a pattern die, and an example of a low-melting point polymer is the epoxy resin EPON SU-8 manufactured by Shell Chemicals. When the membrane decomposes, the process may need to wick or remove the wax or polymer during the heating step to clear the cells from which the membrane decomposed.

Regardless of which particular type of plate the process employs, the pattern in the heat decomposable polymer layer forms the printing pattern. FIG. 15 shows an embodiment of a system using such a polymer. In this example, the substrate 10 has a curved or cylindrical shape, the surface of which receives a coating of the heat decomposable polymer 12. A laminate roll such as 86 may provide the coating, or the coating may result from a roller applicator, such as an anilox roller, a doctor-blade applicator, a liquid extrusion applicator or even a spray applicator or a mist coater, as examples.

The heat decomposable polymer layer may be rolled up on roller 86 similar to a roll of dry-film resist. The polymer may be coated on a carrier film and the carrier film may be peeled off after laminating the polymer to the substrate 10. Moreover, the decomposable polymer film may be held on a carrier film or carrier foil that is pointed towards the substrate 10. In this case the carrier and polymer films may be stretched around substrate 10. When the heat decomposable polymer is applied in liquid form to the substrate 10, a subsequent drying step to drive off the solvent is usually required.

If the process includes the UV laser 16, the laser illuminates the polymer 12, and heater 18 heats the polymer to decompose a desired amount of the exposed polymer. The UV laser can be scanned over the surface 12 using a polygon raster output scanner (ROS) similar to the ones employed in xerographic printers. The illumination may also occur by an array of light emitting diodes or laser diodes combined with an appropriate focusing optics. Moreover, the laser system 16 may also be replaced by a light projection system based on light modulators such as DMD mirror arrays.

As mentioned previously, the process may not require the UV laser or other light sources and a thermal print head or an array of microheaters may take the place of the heater 18. These elements that cause the decomposable polymer to decompose, either by imaging a pattern onto the surface using UV light, or locally heating the polymer, such as in a thermal printhead or an array of microheaters, will be referred to here as pattern applicators. The components apply the printing pattern to the decomposable polymer such that when it is heated, it decomposes to form the printing pattern.

In this example, once the heat source decomposes the polymer, an ink source 80 inks the surface for subsequent transfer to a blanket roller 82. The inking step may be similar to methods used in offset, gravure or flexographic systems and it may involve ink rollers, anilox roller or blade-type ink applicators. The blanket roller 82 transfers the ink to the printing substrate such as a piece of paper 84. The blanket roller 82 may be a rubber coated roller. After one print cycle has completed, the print surface may be inked again in order to print the same image another time.

For printing a new image, the system replaces the heat decomposable polymer. In order to replace the polymer sheet, it may be simply peeled off the substrate 10, or it may be dissolved and wiped off the roll. Alternatively, after wiping off the ink, the polymer layer may be flood exposed and then thermally decomposed. This may be followed by a cleaning step in order to wipe off residue. A recoating subsystem that may include the peeling mechanism, flood illumination, cleaning process, etc., may then replenish the polymer in a liquid coating system as discussed above, including a coating roller, a sprayer to spray the coating, etc. The recoating subsystem may replenish via a lamination system, as well. For a color printing system, several units as shown in FIG. 15 may be grouped to provide printing of cyan, magenta, yellow and other colors. This is similar to common color printing stations for flexography, gravure or offset.

An alternative approach to a printing press type of application uses the decomposable polymer in a screen printing process. FIG. 16 shows an example of a decomposable polymer laminated or otherwise attached to or coated onto a porous substrate. The screen printing process typically uses a porous material having a fine weave, such a silk, nylon, rayon or stainless steel. The porous substrate 90 has areas of the decomposable polymer 92 that serve to block the ink 94 applied by the blade or squeegee 96. The openings in the polymer would allow ink to pass through the screen, forming the print image. The printing plate in this instance is the screen, and the regions that block or allow ink to flow through form the printing pattern. Also the screen printing plate could be curved or rolled into a cylinder for rotary screen printing.

In this manner, many alternatives may form a printing plate using a heat decomposable polymer. The process may employ UV laser diodes, a lower power solution than the high powered laser ablation techniques currently available. In addition, the heat decomposable polymer may work in a print system in which the polymer sheet performs one printing process and then replenishes or is replaced.

It will be appreciated that several of the above-disclosed and other features and functions, or alternatives thereof, may be desirably combined into many other different systems or applications. Also that various presently unforeseen or unanticipated alternatives, modifications, variations, or improvements therein may be subsequently made by those skilled in the art which are also intended to be encompassed by the following claims.

The invention claimed is:

1. A printing plate, comprising:

a substrate; and a layer of a photodefinable, heat decomposable polymer arranged adjacent to the substrate that decomposes in selected regions defined by exposure to light prior to upon the application of heat;

a printing pattern formed by wells in the defined regions of the photodefinable, decomposable polymer layer.

2. The printing plate of claim 1, wherein the printing plate comprises one of an offset printing plate, a dry offset printing plate, a gravure printing plate, a flexographic printing plate, or a screen printing plate.

3. The printing plate of claim 1, wherein the photodefinable, heat decomposable polymer comprises a photodefinable, heat decomposable polymer for which decomposition occurs in the photodefined areas at temperatures less than 300 degrees Celsius.

4. The printing plate of claim 1, the printing plate further comprising one of either microheaters or heat absorbing pixels formed in an array under the heat decomposable polymer to cause decomposition of the heat decomposable polymer.

5. The printing plate of claim 1, wherein an ink-repelling layer resides on the photodefinable, heat decomposable polymer layer such that the defined regions correspond to regions from which the ink-repelling layer has been removed.

6. The printing plate of claim 1, wherein the printing plate comprises a layer forming walls between the substrate and the heat decomposable polymer the walls forming microcells, such that the defined regions further comprise selected ones of the microcells from which the polymer has been decomposed.

7. The printing plate of claim 1, wherein the photodefinable, decomposable polymer comprises a polymer having multiple layers, wherein each layer is sensitive to different wavelengths of light to allow fabrication of different pit depths.

8. A printing system, comprising:

a printing plate comprising:

a substrate; and a photodefinable, heat decomposable polymer arranged adjacent to the substrate, the photodefinable, heat decomposable polymer being decomposable in photodefined areas exposed to light;

a pattern applicator to define a printing pattern on the printing plate by exposing selected areas to light forming the photodefined areas;

a heater to heat the printing plate to decompose the decomposable polymer in the photodefined areas into the printing pattern such that the polymer decomposes upon the application of heat forming wells in the printing plate corresponding to the printing pattern;

an ink source to apply ink to the printing plate after forming the printing pattern; and a mechanism to carry a printing substrate to the printing plate for transfer of the ink.

9. The printing system of claim 8, the printing system comprising a recoating subsystem to recoat the printing plate with the decomposable polymer before replacing the printing pattern with a new printing pattern.

10. The printing system of claim 8, wherein the recoating subsystem comprises one of either a liquid coating system or a laminating system.

11. The printing system of claim 8, wherein the printing plate comprises a roller coated with photodefinable, heat decomposable polymer.

12. The printing system of claim 8, wherein the pattern applicator comprises an ultraviolet light source.

13. The printing system of claim 8, comprising a blade to remove excess ink such that ink remains in the decomposed regions.

14. The printing system of claim 8, wherein the heater comprises one of a hot plate, a heated drum, or an infrared light source.

15. A method of forming a printing plate, comprising:

providing a substrate;

coating the substrate with a photodefinable, heat decomposable polymer that decomposes upon application of heat to form a plate;

applying a printing pattern to the printing plate by exposing selected photodefined regions of the printing plate to actinic light; and forming the printing pattern in the photodefinable, heat decomposable polymer by selectively decomposing the photodefined regions of the photodefinable, heat decomposable polymer by application of heat such that a combination of wells and non-decomposed regions of the heat decomposable polymer for the printing pattern.

16. The method of claim 15, wherein coating the substrate further comprises one of laminating, spraying, rolling or adhering the heat decomposable polymer onto the substrate.

17. A method of forming a printing plate, comprising:

providing a substrate;

coating the substrate with a heat decomposable polymer that decomposes upon application of heat to form a plate; and exposing the heat decomposable polymer to heat from an array of heat sources, wherein selected ones of the heat sources are activated to selectively decompose regions of the heat decomposable polymer to form wells, allowing remaining portions of the heat decomposable polymer and the wells to be used as the printing plate.

18. The method of claim 17, wherein exposing the heat decomposable polymer to heat from an array of heat sources comprises exposing the heat decomposable polymer to one of an array of microheaters or a thermal print head.

* * * * *